United States Patent
Song et al.

(10) Patent No.: US 8,582,247 B2
(45) Date of Patent: Nov. 12, 2013

(54) MAGNETIC ELEMENT WITH INCREASED SCISSORING ANGLE

(75) Inventors: Dian Song, Eden Prairie, MN (US);
Dimitar V. Dimitrov, Edina, MN (US);
Mark W. Covington, Edina, MN (US);
Jiexuan He, St. Paul, MN (US); Scott Stokes, Maple Grove, MN (US); Jason Gadbois, Shakopee, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 169 days.

(21) Appl. No.: 13/043,253

(22) Filed: Mar. 8, 2011

(65) Prior Publication Data
US 2012/0229935 A1   Sep. 13, 2012

(51) Int. Cl.
*G11B 5/39* (2006.01)

(52) U.S. Cl.
USPC .................................................. 360/315

(58) Field of Classification Search
USPC .................. 360/313, 315, 324.12, 324.2; 428/811.2, 815, 816
See application file for complete search history.

(56) References Cited

U.S. PATENT DOCUMENTS

| | | | |
|---|---|---|---|
| 5,739,988 A | 4/1998 | Gill | |
| 6,433,973 B1 * | 8/2002 | Li et al. | 360/324.11 |
| 6,605,836 B2 * | 8/2003 | Kishi et al. | 257/295 |
| 6,735,062 B1 * | 5/2004 | Pokhil et al. | 360/324.12 |
| 6,934,130 B2 | 8/2005 | Ikarashi | |
| 7,035,062 B1 | 4/2006 | Mao et al. | |
| 7,075,761 B2 * | 7/2006 | Parker | 360/327.3 |
| 7,271,986 B2 * | 9/2007 | Sapozhnikov et al. | 360/324.12 |
| 8,179,642 B2 * | 5/2012 | Kawamori et al. | 360/319 |
| 8,310,792 B2 * | 11/2012 | Ohta et al. | 360/324.12 |
| 2008/0102316 A1 * | 5/2008 | Akimoto et al. | 428/811.2 |
| 2011/0007426 A1 * | 1/2011 | Qiu et al. | 360/313 |
| 2011/0134572 A1 * | 6/2011 | Qiu et al. | 360/313 |

\* cited by examiner

*Primary Examiner* — Will J. Klimowicz
(74) *Attorney, Agent, or Firm* — Hall Estill Attorneys at Law

(57) ABSTRACT

An apparatus and associated method is presently disclosed for a data sensing element capable of detecting changes in magnetic states. Various embodiments of the present invention are generally directed to a magnetically responsive lamination that has a spacer layer disposed between a first and second ferromagnetic free layer. The lamination having at least one free layer with a shape feature that increases a scissoring angle between the free layers.

20 Claims, 5 Drawing Sheets

FIG. 3
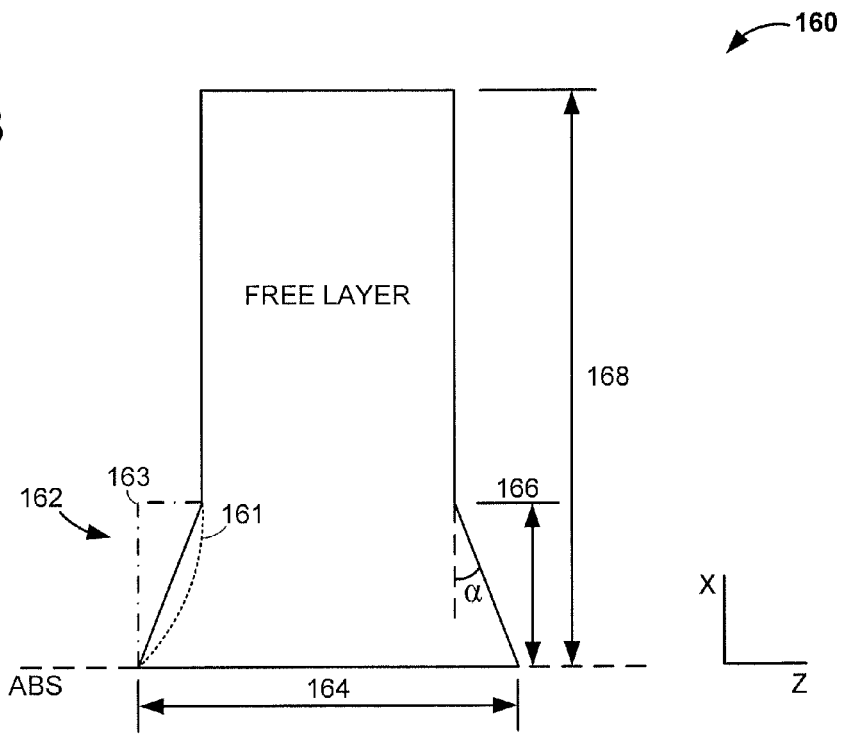
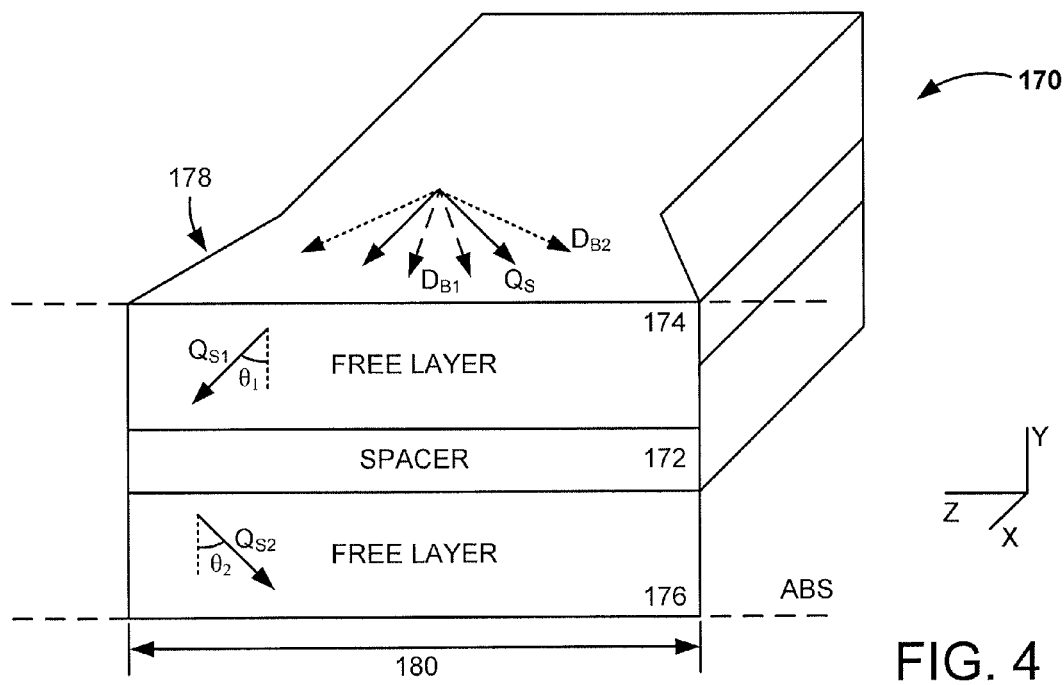
FIG. 4

MAGNETIC ELEMENT WITH INCREASED SCISSORING ANGLE

SUMMARY OF THE INVENTION

Various embodiments of the present invention are generally directed to a data sensing element capable of detecting changes in magnetic states. In accordance with various embodiments, a magnetically responsive lamination has a spacer layer disposed between a first and second ferromagnetic free layer. The lamination has at least one free layer with a shape feature that increases a scissoring angle between the free layers.

These and other features and advantages which characterize the various embodiments of the present invention can be understood in view of the following detailed discussion and the accompanying drawings.

BRIEF DESCRIPTION OF THE DRAWINGS

FIG. 3 displays a top plan view of a portion of an exemplary magnetic stack capable of being used in the magnetic element of FIG. 2.

FIG. 4 shows an isometric view of an exemplary magnetic stack as constructed and operated in accordance with various embodiments of the present invention.

DETAILED DESCRIPTION

A data sensing element that is capable of detecting magnetic fluctuations is generally disclosed herein. Electronics devices are becoming more sophisticated and demand for higher data capacity as well as improved data transfer rates have placed added emphasis on the areal density of a data storage devices. Raising the areal density of a device requires smaller reading components that accurately read more data bits for a given area. However, a reduction in the size of a data reader can lead to magnetic instability and inaccurate data sensing through the presence of noise and meager downtrack resolution.

A magnetic sensing element with dual magnetically free ferromagnetic layers and an increased stripe height, as measured from an air bearing surface (ABS), can have enhanced performance and stability characteristics for ever increasing high linear bit density applications. However, the increased stripe height of a dual free layer element can suffer from magnetic instability in situations where neighboring ferromagnetic free layers "scissor" asymmetrically in response to encountered data bits. It has been observed that "scissoring angle" between the magnetizations of the free layers of less than 90 degrees in a quiescent state can accentuate such asymmetry.

Thus, an improvement to a magnetic sensing element that maintains a scissoring angle between the free layers can increase linear data bit density capacity through enhanced magnetic response accuracy and reduced asymmetry. An increased linear bit density capability can be provided by a magnetic sensing element constructed with a magnetic stack lamination that has a spacer layer disposed between a first and second ferromagnetic free layer and at least one free layer that has a shaped feature which increases a scissoring angle between the free layers.

Figure 1:
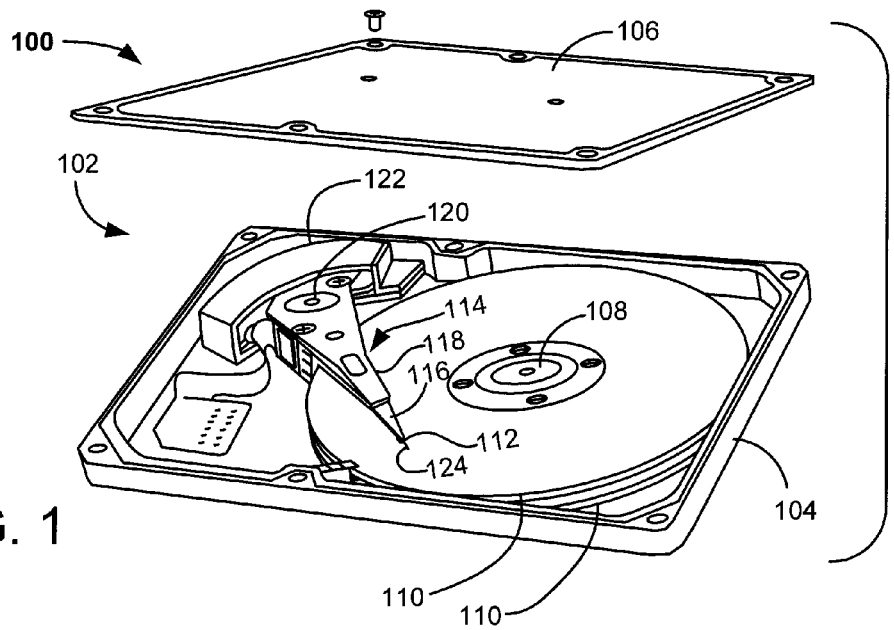
FIG. 1 is a perspective view of an exemplary data storage device.

FIG. 1 provides an exemplary data storage device 100 that is capable of utilizing such a magnetic element in accordance with various embodiments. The device 100 is provided to show an exemplary environment in which various embodiments of the present invention can be advantageously practiced. It will be understood, however, that the claimed invention is not so limited.

The device 100 includes a substantially sealed housing 102 formed from a base deck 104 and top cover 106. An internally disposed spindle motor 108 is configured to rotate a number of storage media 110. The media 110 are accessed by a corresponding array of data transducers that are each supported by a head gimbal assembly (HGA) 112. Each HGA 112 can be supported by a head-stack assembly 114 ("actuator") that includes a flexible suspension 116, which in turn is supported by a rigid actuator arm 118. The actuator 114 preferably pivots about a cartridge bearing assembly 120 through application of current to a voice coil motor (VCM) 122.

In this way, controlled operation of the VCM 122 causes the transducers 124 of the HGA 112 to align with tracks (not shown) defined on the media surfaces to store data thereto or retrieve data therefrom. An ability to decrease the width of the tracks while maintaining proper alignment of the transducers 124 can be accomplished by decreasing the operational thickness of at least one transducing magnetic element. Thus, the device 100 can have increased capacity through the incorporation of transducing elements with reduced operational thickness which corresponds to a higher linear density resolution.

Figure 2:
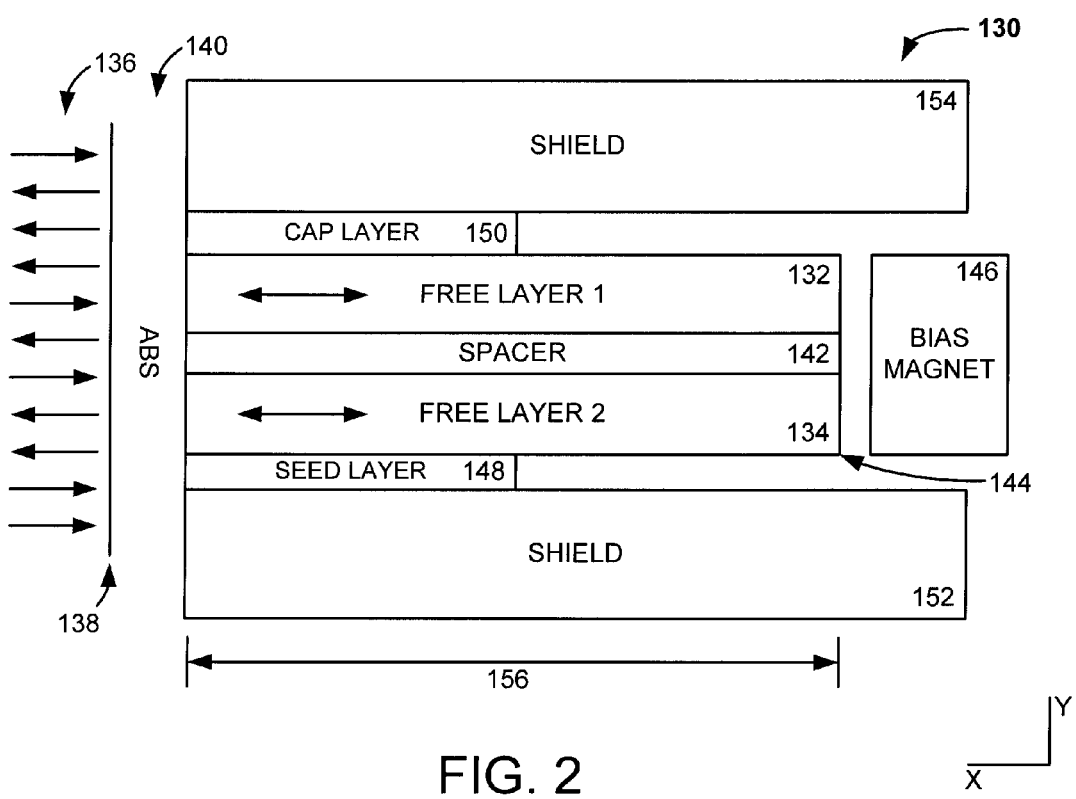
FIG. 2 generally illustrates an exemplary magnetic element capable of being used in the data storage device of FIG. 1.

FIG. 2 displays a cross-section view of exemplary block representation of a magnetic element 130 capable of being used in the device 100 of FIG. 1. The element 130 has first and second ferromagnetic free layers 132 and 134 that are each sensitive to external magnetic fields. That is, each free layer 132 and 134 will respond to an encountered external magnetic field, such as programmed magnetic bits 136 on a data storage medium 138 separated from the free layers 132 and 134 by an ABS 140. The relative angle between free layer 132 and 134 will be different for media fields pointing into or out of the ABS, as measured along the X axis, which will translate to low or high resistance/voltage state. By doing so, binary information stored in media is recovered.

The free layers 132 and 134 are each contactingly adjacent a non-magnetic spacer layer 142 that acts to provide a measureable magnetoresistive effect between layers 132 and 134. While the spacer 142 can be constructed of a non-magnetic material with a predetermined thickness, as shown in FIG. 2, a variety of different non-limiting configurations can be used, as desired, to accommodate varying free layer magnetic interactions and bit 136 sensing. The coupled lamination of the free layers 132 and 134 to the spacer layer 142 can be characterized as a magnetic stack 144 that is influenced, in some embodiments, by a rear mounted bias magnet 146 that imparts a predetermined magnetic field on the free layers 132 and 134 to set a default magnetization.

The magnetic stack 144 can further be constructed where each of the free layers 132 and 134 are additionally coupled to a respective electrode layer, such as seed layer 148 and cap layer 150 that provide appropriate growth template (seed) or protection (cap) during sensor definition process. It is contemplated, however, that the magnetic element 130 is constructed without the electrode layers while in other embodiments the composition, shape, and placement of the electrode layers 148 and 150 are modified, as needed, to provide performance and manufacturing benefits.

While encountering the data bits 136 of the data storage medium 138 along a particular data track (not shown), data bits from adjacent tracks can inadvertently be sensed by the magnetic stack 144. At least one shield layer can therefore be attached to each of the electrode layers 148 and 150 on opposite sides of the free layers 132 and 134 to reduce or eliminate such inadvertent data bit sensing. The shield layers 152 and 154 can be oriented in a variety of formations and compositions, none of which are required or limited, to direct unwanted magnetic flux away from the free layers 132 and 134.

The shielding of the magnetic stack 144 can be supplemented with other shield layers, such as side shields, that combine with shield layers 152 and 154 to allow for improved magnetic sensing of programmed bits 136 from the preset tracks in the storage medium 138 by eliminating noise and inadvertent sensing of adjacent bits. The size and number of shielding layers can influence the magnetization strength needed to reliably operate the magnetic stack 144.

The stack magnetic stability can be increased with the elongation of the stack's stripe height 156, as measured along the X axis. The extended stripe height 156 can enhance robustness against process variability and external disturbances while providing heightened magnetization strength through anisotropic interactions between the layers. However, the elongated stripe height 156 can lead to high magnetic asymmetry when the stack 144 encounters the data bits 136. The magnetic asymmetry can be product of a reduced scissoring angle between the magnetizations of the free layers 132 and 134 of the stack 144 in a quiescent state.

Accordingly, various embodiments of the present invention increase the scissoring angle between the free layers 132 and 134 by including a shape feature on at least one of the free layers. The shape feature raises the scissoring angle by increasing the width of one, or both, of the free layers proximal to the ABS, which generates predetermined magnetostatic interactions and promotes orthogonal free layer magnetizations. FIG. 3 displays a top plan view of an exemplary free layer 160 that is configured with a shape feature 162.

As shown, the shape feature 162 is a lateral tapered extension, as measured along the Z axis, which increases the width of the free layer 160 at the ABS to a predetermined taper width 164. The shape feature 162 is configured to transition to a tapered sidewall at taper height 166 from the ABS, which is less than the overall stripe height 168 of the free layer 160, as measured along the X axis. The taper width and height 164 and 166 can be tuned to produce predetermined taper angle ($\alpha$) of the feature 162. While a specific taper angle is not required, in some embodiments a 10° angle is constructed to provide improved asymmetry control without unduly widening the free layer 160.

The shape feature 162 is not limited by the tapered configuration displayed in FIG. 3. In fact, any free layer 160 sidewall transition that extends the free layer's width proximal to the ABS can be used to increase the scissoring angle of the magnetization of the free layer 160. For example, a trapezoidal, continuously curvilinear 161, or orthogonal notch 163 sidewall transition can extend the free layer width to the taper width 164. Similarly, the taper height 166 can extend as far away from the ABS as desired. With such variability in the taper angle, width 164, and height 166, the shape feature 162 can be precisely tuned to provide a desired magnetization angle in the free layer 160.

While the width of the free layer(s) and the corresponding magnetic element width can be raised with the shape feature, the enhanced magnetic readability through reduced responsive asymmetry compensates for the minimal increased width of the element. Thus, a balance is achieved between the increased element width and orthogonal free layer magnetization to provide enhanced magnetic element responsiveness and accuracy, particularly with respect to high linear data bit densities.

FIG. 4 shows an isometric view of a magnetic stack 170 that incorporates the shape feature 162 of FIG. 3. The stack 170 has a spacer layer 172 that is disposed between and contactingly adjacent a first and second free layer 174 and 176, all three layers having a shape feature 178 symmetrical about a longitudinal axis (X axis) of the stack 170 that extends laterally to a taper width 180 at the ABS. Each free layer 174 and 176 has a respective magnetization $Q_{S1}$ and $Q_{S2}$ that is oriented at a respective angle $\theta_1$ and $\theta_2$ that combine to equal 90° or more. That is, each magnetization angle $\theta_1$ and $\theta_2$ can be different degree magnitudes, but are cumulatively 90° or more, as displayed by solid lines ($Q_S$).

With the magnetizations $Q_S$ of the free layers 174 and 176 equaling 90° or more in the quiescent state, the "scissoring" movement of the free layer magnetizations, as displayed by segmented lines $D_{B1}$ and $D_{B2}$, in response to external data bits, such as bits 136 of FIG. 2, become narrower or wider depending on the magnetic orientation of the data bit. In other words, as the stack 170 encounters external data bits, the magnetizations of the respective free layers 174 and 176 will change angular direction to a narrow or wider orientation that is sensed as either logical state 1 or 0.

Figure 5:
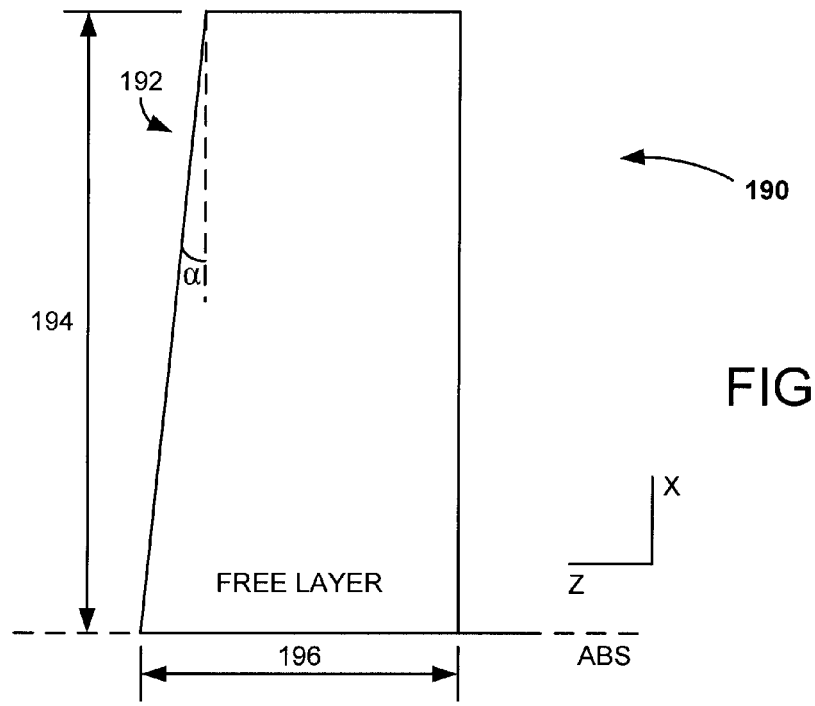
FIG. 5 shows a top plan view of a portion of an exemplary magnetic stack constructed and operated in accordance with various embodiments of the present invention.

In FIG. 5, a top plan view of an exemplary free layer 190 is displayed with a shape feature 192 that is constructed in accordance with various embodiments of the present invention. In contrast to the shape feature 162 of FIG. 3 that was symmetrical about the longitudinal axis (X axis) of the free layer and had a taper height that was less than the overall stripe height, the shape feature 192 is exclusively on one lateral side of the free layer 190 and extends along the free layer's entire stripe height 194. Such a configuration can provide manufacturing and operational benefits that can aid in increasing the scissoring angle of a magnetization of the free layer 190.

While the shape feature 192 can be configured with any desired stripe height and symmetrical configuration, a predetermined taper angle ($\alpha$) can be constructed that results in a taper width 196 at the ABS. The added size of the shape feature 192, as compared to shape feature 162 of FIG. 3, can provide added magnetic stability due to enhanced anisotropy. In some embodiments, the free layer 190 is configured with a multitude of differently sized shape features. For instance, the shape feature 192 can be combined with a shape feature on the opposing lateral side that has a different taper height, taper angle, and sidewall transition (notch/curvilinear).

Figure 6:
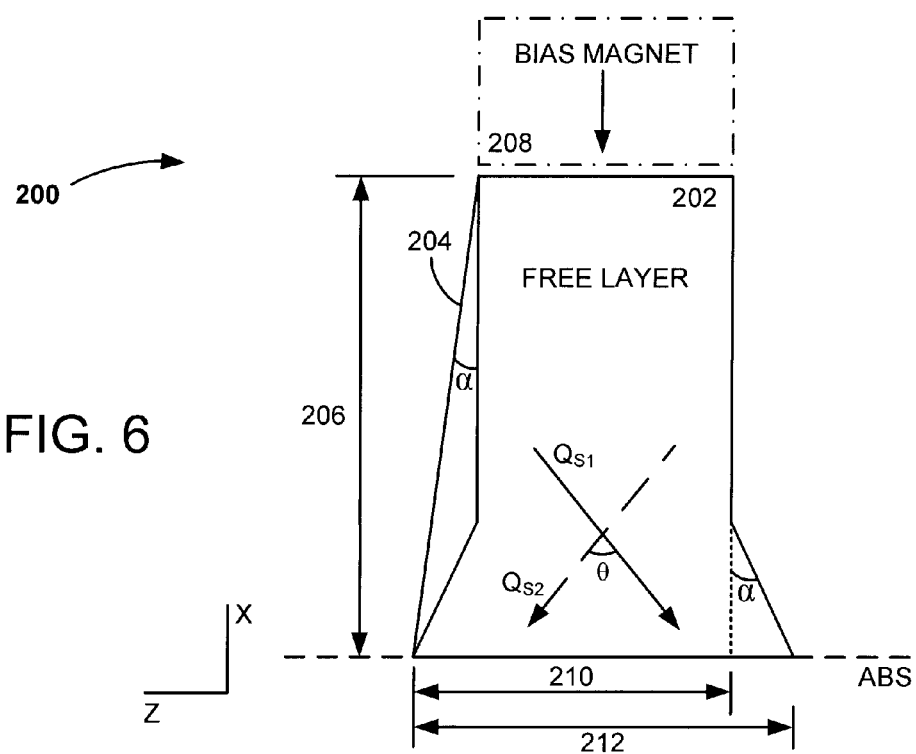
FIG. 6 provides a top plan view of an exemplary magnetic stack constructed and operated in accordance with various embodiments of the present invention.

The combination of different shape features is not exclusive to a single free layer as various configurations can be utilized in a magnetic stack. FIG. 6 generally illustrates a top plan view of such a magnetic stack 200. The stack 200 has first and second free layers 202 and 204 separated by a spacer layer with each layer having a common overall stripe height 206. The first free layer 202 is configured similarly to the layer provided in FIG. 3 while the second free layer 204 resembles the layer provided in FIG. 5.

As constructed, the free layers 202 and 204 are each set with a magnetization ($Q_{S1}$ and $Q_{S2}$) that has a predetermined strength and direction, respectively, and that may or may not be influenced by a rear mounted biasing magnet 208. The symmetric tapered feature of the first free layer 202 produces a magnetization tilt that combines with the magnetization tilt produced by the single tapered side of the second free layer 204 to increase the scissoring angle ($\theta$) of the quiescent magnetization directions. While the free layers 202 and 204 have different shape feature configurations, a common taper angle ($\alpha$) can be used, but not required or limited as varying angles can likewise be used, to produce different taper widths 210 and 212 at the ABS.

The ability to build a magnetic stack with different shape features between the free layers allows a degree of tuning and adjustability for various operational purposes that can prove beneficial with ever increasing linear data bit densities. For example, the varying taper widths 210 and 212 of magnetic stack 200 can provide differing leading and trailing edge response to encountered data bits, which can lead to enhanced bit sensing and narrower data tracks.

Figure 7:
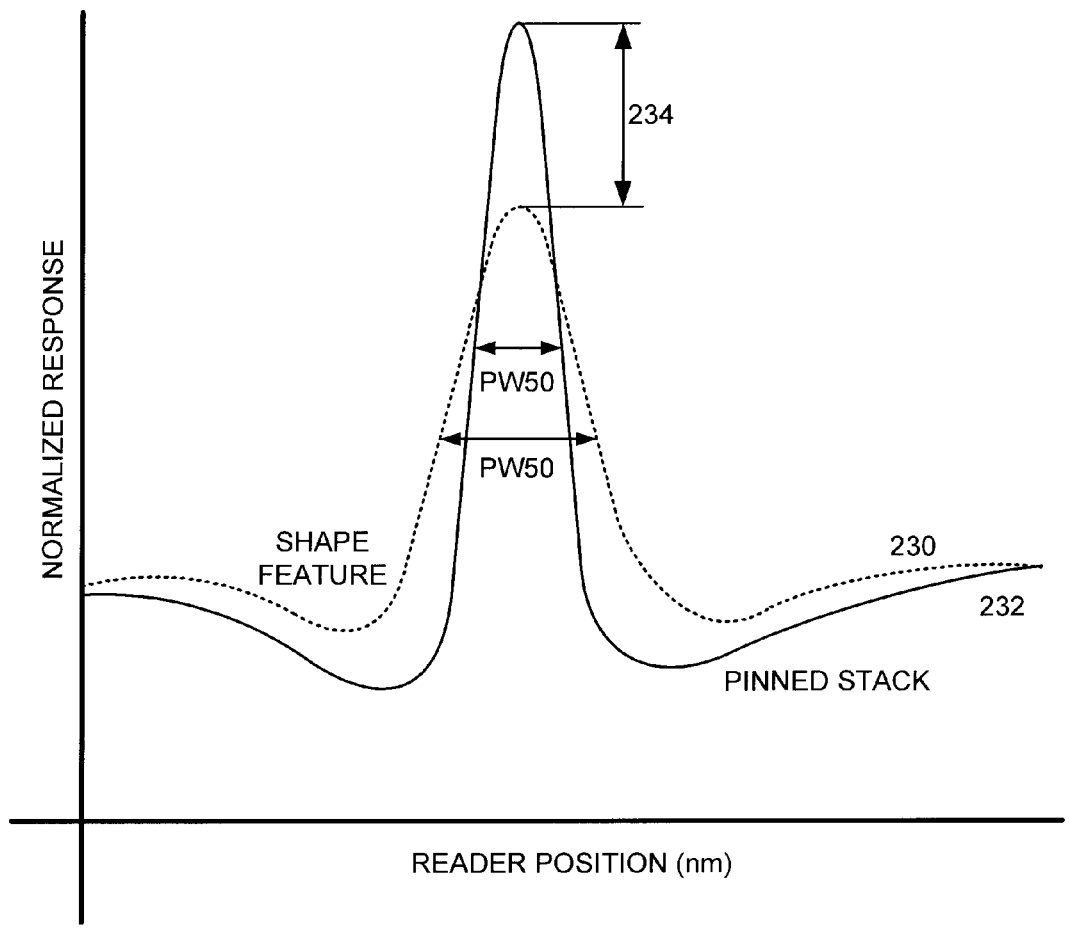
FIG. 7 generally illustrates exemplary operational characteristics of a magnetic element constructed and operated in accordance with various embodiments of the present invention.

FIG. 7 graphs exemplary operational data involving the use of shape features in one or more free layers of a magnetic element. With the elimination of any magnetic pinning and pinned layers from the magnetic stack, a reduced shield-to-shield spacing is achieved. FIG. 7 graphs a normalized response for an exemplary magnetic element employing an increased shield-to-shield spacing due to the addition of a pinning layer(s) in comparison to an element constructed with a dual free layers and at least one shape feature. As a magnetic element encounters a programmed data bit, such as bit 136 of FIG. 2, a pulse is produced with a measurable pulse width, which can be observed at 50% of the pulse amplitude (PW50) to indicative of the operational strength of the element.

The graph of FIG. 7 provides PW50 operational characteristics of an element with at least one shape feature, as represented by segmented line 230, in relation to an element with an increased shield-to-shield spacing due to pinning layer(s), displayed as solid line 232. The response to a data bit for each element is similar, but distinguished by the amplitude and PW50 width. For the shape feature element 230, a low amplitude and wider PW50 is experienced in relation to the pinned stack element 232. The difference in amplitude 234 of the shields in combination with a narrower PW50 supports enhanced operational characteristics of the shape feature element versus an element with the pinned layer(s) and increased shield-to-shield spacing.

With a reduction in the PW50, the magnetic element is capable of greater linear and areal density of data bits, due in part to enhanced down-track resolution of the element. However, the operational benefits of a reduced shield-to-shield spacing are reduced if data sensing is inaccurate. As such, an element can be constructed with an increased lateral width on the ABS that adds minimal shield-to-shield spacing in combination with the enhanced operational benefits of high amplitude with narrow PW50.

Figure 8:
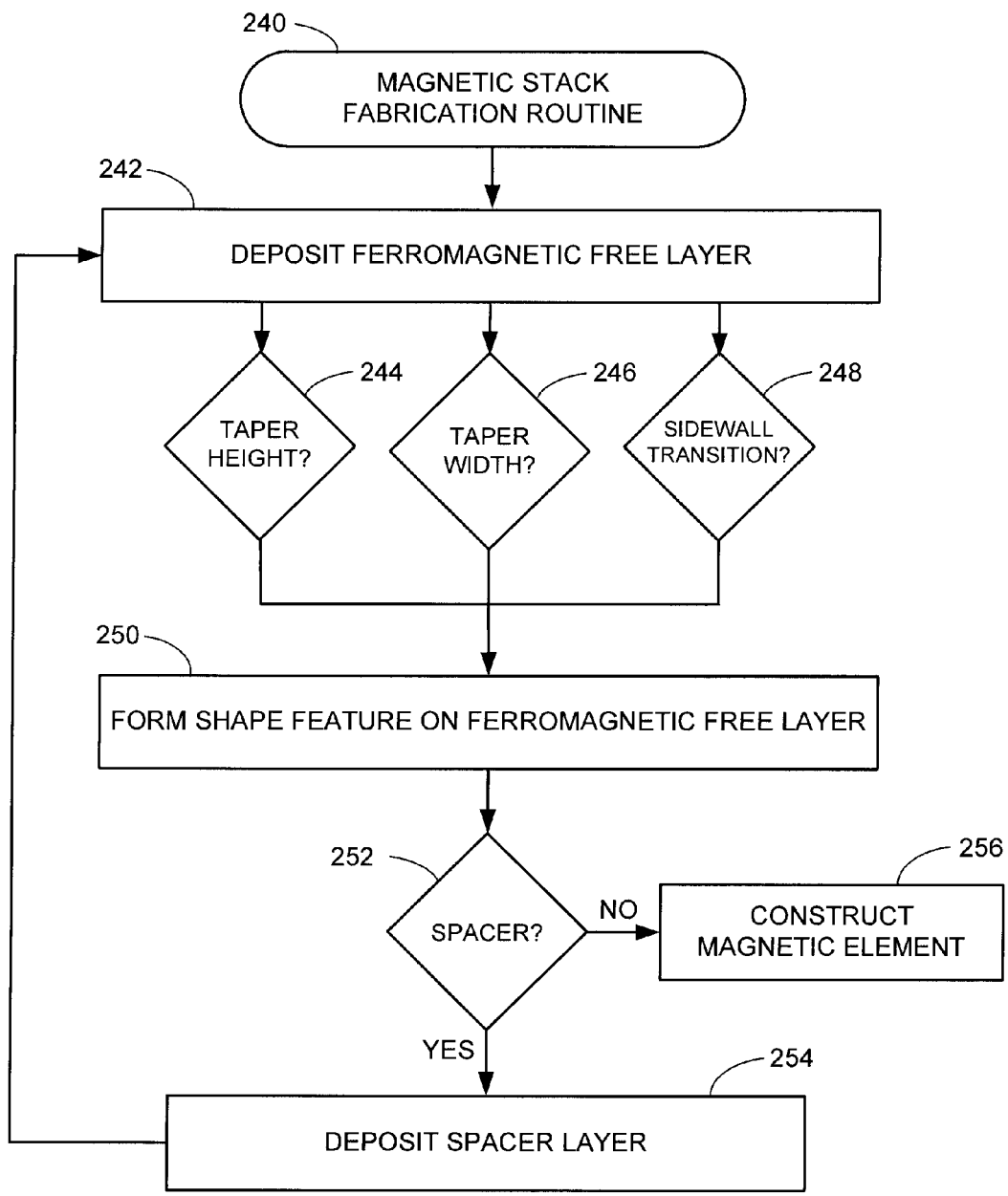
FIG. 8 provides a flow chart of an exemplary MAGNETIC STACK FABRICATION routine performed in accordance with various embodiments of the present invention.

FIG. 8 provides an exemplary magnetic stack fabrication routine 240 performed in accordance with various embodiments of the present invention. A ferromagnetic free layer is initially deposited in step 242, which can be a variety of different materials, such as NiFe, sizes, and shapes. A plurality of decisions 244, 246, and 248 then evaluate if and how a shape feature is to be constructed on the deposited free layer. It should be noted that the decisions in routine 240 are merely exemplary and are not an exhaustive or limiting list of criteria used to determine the desired configuration of a shape figure to be formed on the free layer deposited in step 242.

Decisions 244, 246, and 248 determine the taper height, taper width, and sidewall shape of a shape feature, respectively. With a determination of the desired configuration of the shape feature, the free layer is manipulated in step 250 to form the designed shaped feature. It is contemplated that step 250 can comprise a number of different sub-steps in which various formation processes, such as masking, etching, and sputtering, are conducted to construct the desired shape feature. In some embodiments, various shape feature characteristics, such as taper angle, height, and width, are measured and verified against predetermined tolerances before the routine 240 proceeds.

The completion of the free layer and shape feature leads routine 240 to decision 252 where the inclusion of a spacer layer is contemplated. If the free layer deposited in step 242 is not coupled to a non-magnetic spacer layer, a spacer layer will need to be deposited in step 254 to provide a buffer between two free layers, as shown in FIGS. 2 and 4, which allows data bit sensing through a magnetoresistive effect. Upon deposition of the spacer layer in step 254, the routine 240 returns to step 242 where a second ferromagnetic free layer is deposited onto the existing spacer layer so that a rough magnetic stack comprised of two free layers separated by a non-magnetic spacer is available.

The various decisions 244, 246, and 248 are then reevaluated to determine if a shape feature is desired, and if so how the shape feature will be configured. The determined shape feature is then formed in step 250 and decision 252 subsequently concludes that a spacer layer is not needed due to the preexisting spacer layer between the two free layers. The constructed magnetic stack proceeds to step 256 where the stack is implemented into a magnetic element with various shields, bias magnets, and electrical connections are made to allow sensing of data bits.

The various decisions and deposition of layers in routine 240 allow for a wide variety of magnetic stack configurations that can provide tuned operational attributes to suit different needs. For instance, either free layer can be constructed with or without a shape feature and with different shape feature configurations, as displayed in FIG. 8. The ability to tune the magnetic stack through routine 240 allows for precise control over the magnetization angles of each free layer and consequently the scissoring angle of the stack. The variability of the stack construction in routine 240 illustrates that the stack fabrication is not limited and merely exemplary as the decisions and steps can be modified, moved, or removed, as desired.

It can be appreciated that the configuration and material characteristics of the magnetic element described in the present disclosure allows for the increase in scissoring angle in the magnetic stack. The inclusion of a shape feature in at least one free layer tilts the layer's magnetization to raise the scissoring angle between the free layers. The ability to increase the scissoring angle through precisely constructed shape features that allow operation specific tuning of free layer magnetizations can enhance data bit sensing, especially in high linear and areal bit density data storage applications It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic stack comprising:
   a magnetically responsive lamination of a spacer layer disposed between a first and second ferromagnetic free layer, at least one free layer having a rectangular shape distal an air bearing surface (ABS) and a non-rectangular shape feature proximal the ABS that increases a scissoring angle between magnetizations of the free layers.

2. The magnetic stack of claim 1, wherein the scissoring angle is increased in a quiescent state.

3. The magnetic stack of claim 1, the non-rectangular shape feature has an increased free layer width proximal to an air bearing surface (ABS).

4. The magnetic stack of claim 1, wherein the non-rectangular shape feature is a tapered sidewall that extends the at least one free layer from a first width to a larger second width.

5. The magnetic stack of claim 4, wherein the tapered sidewall forms a predetermined taper angle with the first width.

6. The magnetic stack of claim 4, wherein the non-rectangular shape feature has a taper height that is less than an overall stripe height of the at least one free layer.

7. The magnetic stack of claim 4, wherein the at least one free layer transitions to the tapered sidewall with a curvilinear transition.

8. The magnetic stack of claim 1, wherein shape feature is a continuously curvilinear sidewall that extends the at least one free layer from a first width to a larger second width.

9. The magnetic stack of claim 1, wherein shape feature is an orthogonal notch that extends the at least one free layer from a first width to a larger second width.

10. The magnetic stack of claim 1, wherein the shape feature is symmetrical about a longitudinal axis of the at least one free layer.

11. The magnetic stack of claim 1, wherein the first free layer has a shape feature while the second free layer has a continuous width throughout an overall stripe height.

12. The magnetic stack of claim 1, wherein the first free layer has a symmetrical shape feature about a longitudinal axis of the first free layer while the second free layer has a non-symmetrical shape feature about the longitudinal axis.

13. The magnetic stack of claim 1, wherein the first free layer has a first shape feature with a taper height that matches an overall stripe height for the first free layer and the second free layer has a second shape feature with a taper height that is less than the overall stripe height.

14. The magnetic stack of claim 1, wherein the spacer layer has a non-rectangular shape feature.

15. A method comprising:
    providing a magnetically responsive lamination of layers with a rectangular shape distal an air bearing surface (ABS) and a spacer layer disposed between a first and second ferromagnetic free layer; and
    configuring at least one free layer with a non-rectangular shape feature that increases a scissoring angle between magnetizations of the free layers.

16. The method of claim 15, wherein a first non-rectangular shape feature is present in the first free layer while a second non-rectangular shape feature is present in the second free layer.

17. The method of claim 15, wherein a shape feature is present in the first free layer while the second free layer has a continuous width throughout a stripe height.

18. The method of claim 16, wherein the first and second non-rectangular shape features have matching taper angles in relation to a common width of the first and second free layers.

19. A magnetically responsive element comprising:
    a magnetically responsive lamination with a spacer layer disposed between a first and second ferromagnetic free layer, the free layers having an extended stripe height, a rectangular shape, and a uniform common width distal to an air bearing surface (ABS); and
    a means for increasing a scissoring angle between magnetizations of the free layers that extends the common width of at least one of the free layers proximal to the ABS.

20. The magnetically responsive element of claim 19, wherein the first free layer has a first non-rectangular shape feature that extends to a first taper width at the ABS and the second free layer has a second non-rectangular shape feature that extends to a second taper width at the ABS, both the first and second taper width being greater than the common width.

* * * * *